United States Patent [19]
Takusagawa

[11] Patent Number: 5,926,484
[45] Date of Patent: *Jul. 20, 1999

[54] FAULT CORRECTION APPARATUS FOR AN ADDRESS ARRAY OF A STORE-IN CACHE MEMORY AND METHOD THEREFOR

[75] Inventor: Midori Takusagawa, Yamanashi, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/738,882

[22] Filed: Oct. 28, 1996

[30] Foreign Application Priority Data

Nov. 21, 1995 [JP] Japan .................................. 7-302817

[51] Int. Cl.⁶ .................................................. G06F 11/00
[52] U.S. Cl. ........................................... 371/10.2; 711/118
[58] Field of Search ........................... 371/10.2; 711/128, 711/3, 118

[56] References Cited

U.S. PATENT DOCUMENTS 5,564,034 10/1996 Miyake ................................... 395/455
5,584,002 12/1996 Emma et al. ........................... 395/403
5,845,321 12/1998 Ito et al. ................................ 711/118

OTHER PUBLICATIONS

J. Archibald et al.; "Cache Coherence Protocols: Evaluation Using a Multi-processor Simulation Model"; ACM Transactions on Computer Systems, vol. 4, No. 4, Nov. 1986, pp. 273–298.

Primary Examiner—Phung M. Chung
Attorney, Agent, or Firm—McGinn & Gibb, P.C.

[57] ABSTRACT

When a fault is detected in data read-out from an address array, a replacement controller registers the address in a replacement buffer. When this address is sent out from the replacement buffer, the address array is invalidated for the address by using an address register and a flush register. During the invalidation process, the processing of the request is suppressed by a pending register, and the request address is held in an address register until the invalidation is completed for use in retrying a cache indexing.

22 Claims, 6 Drawing Sheets

| V102(t) | P103(t) | V202(t+1) | V202(t+2) |
|---|---|---|---|
| 0 | X | 0 | X |
| 1 | 0 | 1 | 0 |
| 1 | 1 | 0 | X |

X : DON'T CARE

FIG.3

| FAULT 270 | HIT/MISS 260 | VALID 212 | BUFFER 300 |
|---|---|---|---|
| NORMAL | HIT | X | NO |
| NORMAL | MISS | INVALID | NO |
| NORMAL | MISS | VALID | YES |
| FAULT | X | INVALID | NO |
| FAULT | X | VALID | YES |

X : DON'T CARE

FAULT CORRECTION APPARATUS FOR AN ADDRESS ARRAY OF A STORE-IN CACHE MEMORY AND METHOD THEREFOR

BACKGROUND OF THE INVENTION

The present invention relates to a fault correction apparatus, and more particularly to a fault correction apparatus for correcting data read out from an address array of a store-in cache memory.

In a store-in (also called a "write-back" or a "copyback") cache memory, information is written only to a block in the cache memory. A modified cache block is written to main memory (this is called a "write-back") only when it is replaced on a cache miss (this is called a "replacement").

In the replacement, a data fault in the address array may cause misjudgment as to whether the block should be written to a main memory. If it is judged incorrectly that the block of the cache memory is unmodified even though the block has been modified, then the irreplaceable modified information is lost. To avoid such a problem, the reliability of the address array must be improved.

From a reliability point of view, a fault may be corrected with an error correction code before determination of a cache "hit"/"miss". However, in such a technique, the fault correction process is a critical path in determining a machine cycle so that the processing speed is decreased.

In the conventional store-in cache described above, it is difficult to determine a cache hit/miss in one machine cycle when a fault is detected in data read-out from the address array. Therefore, the entire system processing is stopped by the system checking when such a fault is detected. This approach inevitably deteriorates the system reliability. On the other hand, if a cache index is processed after correction of a fault, a machine cycle is extended by increasing delay time, so that processing performance deteriorates.

SUMMARY OF THE INVENTION

In view of the foregoing problem of the conventional system, an object of the present invention is to increase system reliability as well as system performance in a store-in cache memory.

In a fault correction apparatus for an address array of a cache memory according to a first aspect of the present invention, the address array has at least one entry. Each entry includes an address tag field, a valid field, and a clean field. A cache hit judgement circuit, connected to the address array, judges whether a cache hit has occurred. A fault correction circuit, connected to the address array in parallel with the cache hit judgement, detects and corrects a fault. A replacement controller, connected to both the cache hit judgement circuit and the fault correction circuit, controls a replacement of an entry in the address array. A replacement buffer, connected to the fault correction circuit and the replacement controller, stores at least one entry to be replaced.

With the unique and unobvious structure of the present invention, system reliability as well as system performance in a store-in cache memory are increased.

BRIEF DESCRIPTION OF THE DRAWINGS

The above-mentioned and other objects, features and advantages of this invention will become more apparent by reference to the following detailed description of the invention taken in conjunction with the accompanying drawings in which:

FIG. 3 is a table showing the function of a valid generator 100 in the store-in cache memory according to an embodiment of the present invention;

FIG. 4 is a table showing the function of a replacement controller 280 in the store-in cache memory according to an embodiment of the present invention;

DETAILED DESCRIPTION OF THE PREFERRED EMBODIMENTS

A fault correction apparatus for an address array of a store-in cache memory in accordance with a preferred embodiment of the present invention will be described in detail with reference to the accompanying drawings.

Figure 1:
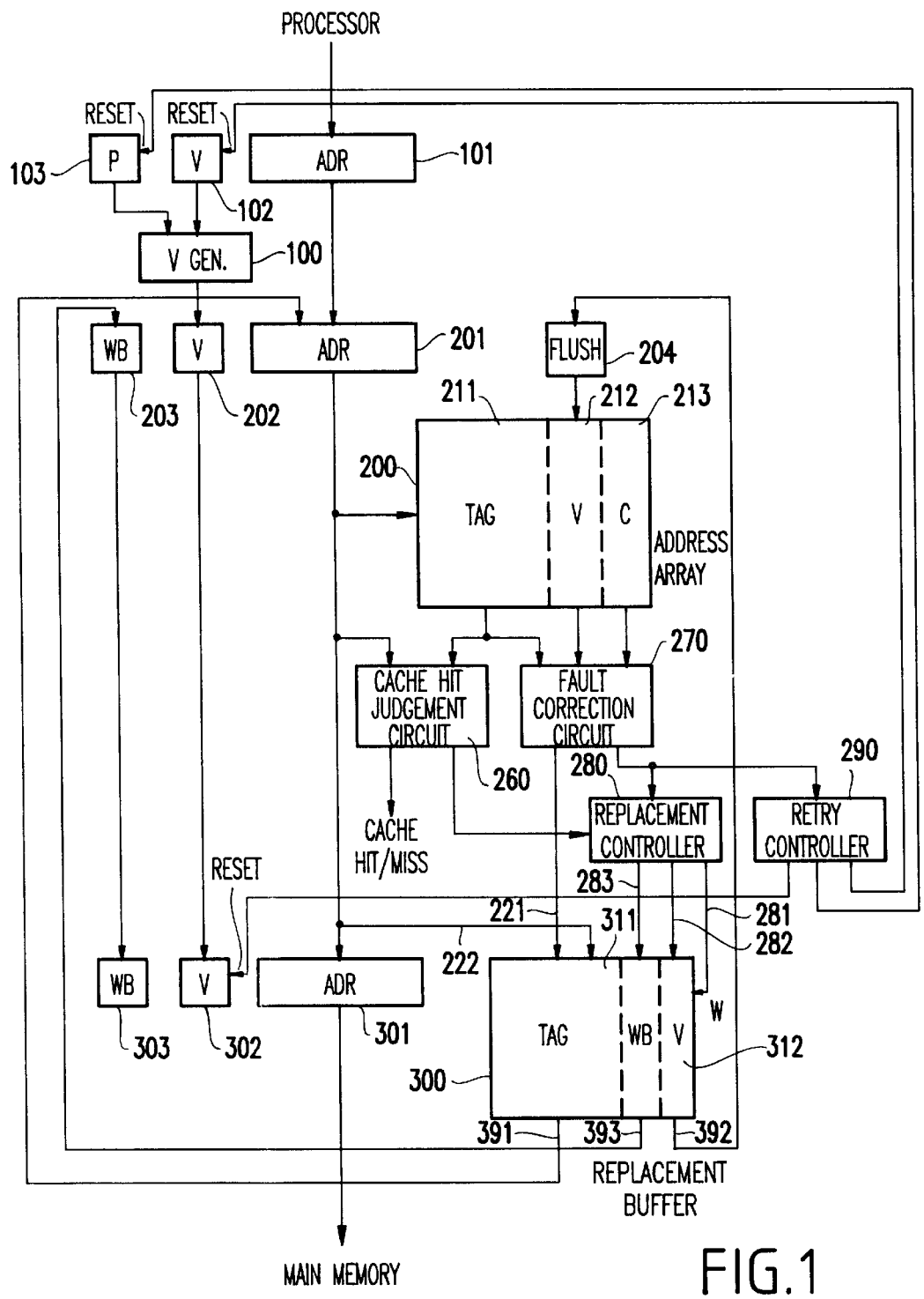
FIG. 1 is a block diagram showing the configuration of a store-in cache memory according to an embodiment of the present invention.

Referring to FIG. 1, a store-in cache memory includes an address array 200 and a data array (not shown), each including a plurality of entries. In each entry, the address array 200 has an address tag (TAG) field 211, a valid (V) field 212, and a clean (C) field 213. The address tag field 211 is used for managing an address of data stored in the cache memory. The valid field 212 represents whether the entry is valid (e.g., V=1 when valid). The clean field 213 represents whether the content of the entry is coincident with a content of the main memory (e.g., C=1 when coincident ("clean"), C=0 when incoincident ("dirty")).

The store-in cache memory has a pipelined structure. In a first stage, there are an address register 101 and a valid register 102. In a second stage, there are an address register 201 and a valid register 202. In a third stage, there are an address register 301 and a valid register 302.

In the first stage, there is a pending register (P) 103 for indicating whether an address stored in the address register 101 is pending (e.g., P=1 when pending). A valid generator 100 in the first stage controls the valid register 202 based on the valid register 102 and the pending register 103.

Specifically, the valid generator 100 performs control so that, while the valid register 102 represents "valid", a subsequent request from the processor is not accepted for processing. If no fault is detected in data read-out from the address array 200, the valid register 102 is reset to be "invalid", thereby enabling it to accept the subsequent request for processing. For example, a fault may be detected by checking parity bits (not shown).

In the second stage, a cache hit judgement circuit 260 judges whether a cache hit occurred. Simultaneously, a fault correction circuit 270 detects whether there is a fault in the address array and, if a fault occurs, corrects the fault. A replacement controller 280 controls a replacement of the entry of the address array 200. The replacement controller 280 receives information whether a cache miss occurred from the cache hit judgement circuit 270. The replacement controller 280 also receives information whether a fault is detected from the fault correction circuit 270.

A retry controller 290 controls a retry of accessing to the address array 200. The retry controller 290 receives information whether a fault is detected from the fault correction circuit 270. The retry controller 290 resets the valid register 102 to be "invalid" when no fault is detected. The retry controller 290 resets the valid register 302 to be "invalid" and sets the pending register 103 to be "pending" when a fault is detected.

A flush register 204 is used for flushing (invalidating) the entry to be replaced in the address array 200. A feature of the present invention is that an output of the cache hit judgement circuit 260 is not input to the fault correction circuit 270 (e.g., circuits 260 and 270 are not in series). Thus, the cache hit judgement circuit 260 and the fault correction circuit 270 work simultaneously (in parallel).

In the third stage, there is a replacement buffer 300 for buffering replaced entries to be stored in the main memory from address register 301. The replacement buffer 300 has at least one entry. Each entry has an address field 311, a valid (V) field 312, and a write-back (WB) field 313.

A write-back flag in the write-back field 313 represents whether the entry should be written back to the main memory (e.g., WB=1 when the write-back is necessary). After output from the replacement buffer 300, an address stored in the address field 311 is set to the address register 201, a valid bit stored in the valid field 312 is set to the flush register 204, and a write-back flag stored in the write-back field 313 is set to a write-back register 203 in the second stage for invalidation. After the invalidation, an address stored in the address register 201 is set to the address register 301, and a write-back flag stored in the write-back register 203 is set to a write-back register 303 in the third stage. If the write-back register 303 represents "write-back necessary" and the valid register 302 represents "valid", then the address register 301 is used for storing the corresponding data stored in the data array to the main memory.

Figure 2:
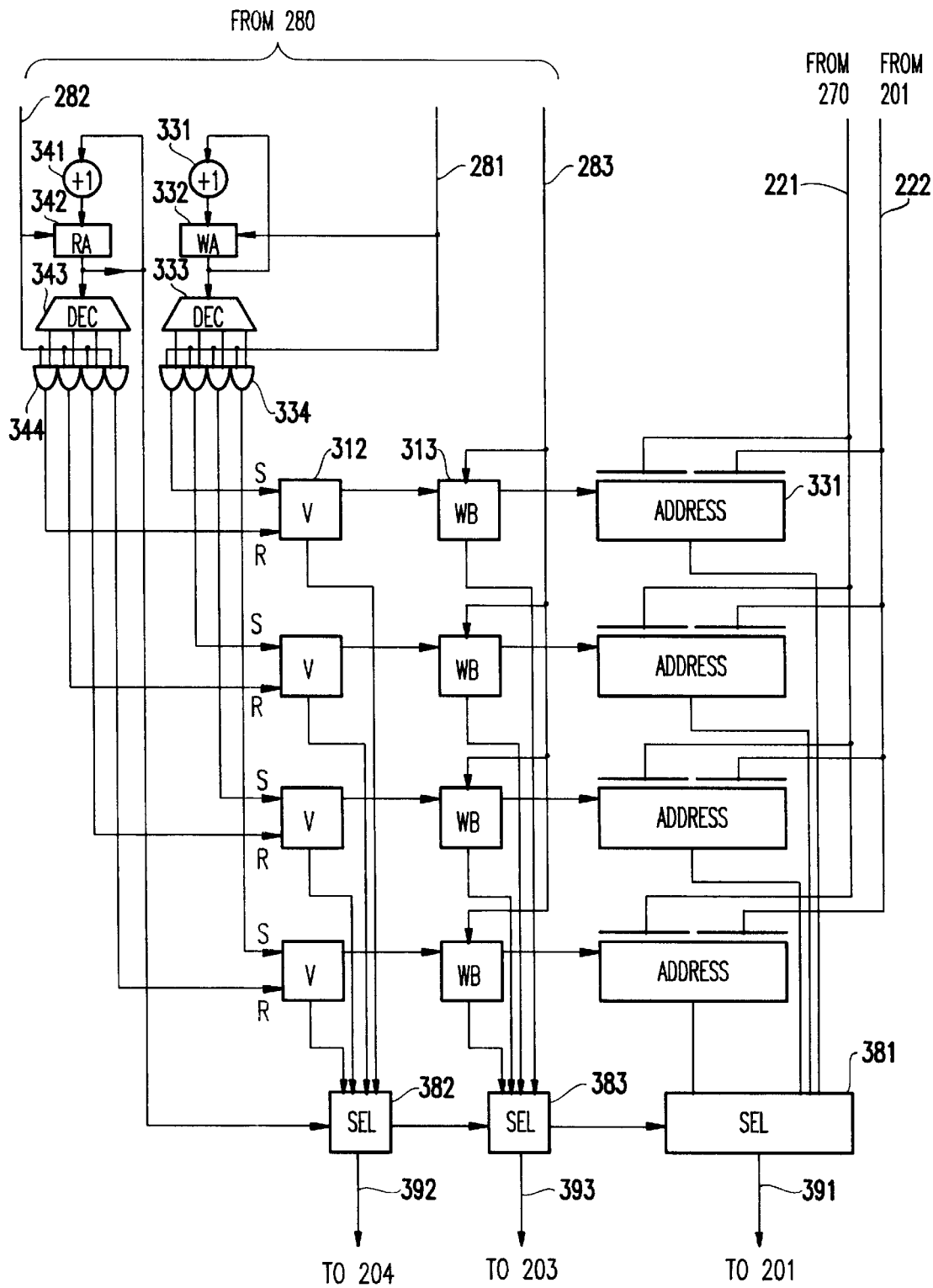
FIG. 2 is a block diagram showing the configuration of a replacement buffer 300 in the store-in cache memory according to an embodiment of the present invention.

Referring to FIG. 2, one example of the replacement buffer 300 has four entries of the address field 311, the valid field 312, and the write-back field 313. The replacement buffer 300 preferably has a first-in first-out (FIFO) structure.

The address fields 311 are set by the address tag portion (upper portion) via signal line 221 from the fault correction circuit 270, and the remaining portion (lower portion) via signal line 222 from the address register 201. The write-back fields 313 are set via signal line 283 from the replacement controller 280.

An entry to be stored is determined by a write control mechanism including an incrementor 331, a write address register 332, a decoder 333, and AND gates 334. The write address stored in the write address register 332 is incremented by the incrementor 331 at a timing given by a signal line 281. The decoder 333 decodes the write address from the write address register 332. One of the valid fields 312 selected by the AND gates 334 is set to "valid". At the same time, the address field 311 in the same entry stores an address on the signal lines 221 and 222. Similarly, the write-back field 313 in the same entry stores a write-back flag on the signal line 283.

An entry to be read-out is determined by a read control mechanism including an incrementor 341, a read address register in the read address register 342, a decoder 343, and AND gates 344. The read address 342 is incremented by the incrementor 341 at a timing given by a signal line 282. The decoder 343 decodes the read address in register 332. One of the valid fields 312 selected by the AND gates 344 is reset to "invalid". Selectors 381, 382, and 383 select the addresses in the address fields 311, the valid bits in the valid fields 312, and the write-back flags in the write-back fields 313, respectively, based on the read address in the read register 342.

Referring to FIG. 3, the valid generator 100 controls the valid register 202 to be "invalid" one timing after the valid register 102 represents "invalid". Also, one timing after the valid register 102 represents "valid" and the pending register 103 represents "pending", the valid register 202 is controlled to be "invalid". If the valid register 102 represents "valid" and the pending register 103 represents "not pending", then the valid register 202 represents "valid" in the next timing and "invalid" in the next subsequent timing so that the address array 200 is accessed at only one timing.

Referring to FIG. 4, the replacement controller 280 controls the operation for writing into the replacement buffer 300. The replacement buffer 300 stores an entry to be replaced when a fault has not occurred, a cache miss occurred, and a valid field 212 in the entry to be replaced represents "valid". The replacement buffer 300 also stores an entry to be replaced when a fault occurred, and a valid field 212 in the fault entry represents "valid". A feature of the present invention is that a fault entry is stored in the replacement buffer 300 even though a cache hit has occurred.

Hereinbelow and referring to FIGS. 1, 5, 6, 7, and 8, the operation of the fault correction apparatus in accordance with the above-mentioned embodiment of the present invention will be described.

Figure 5:
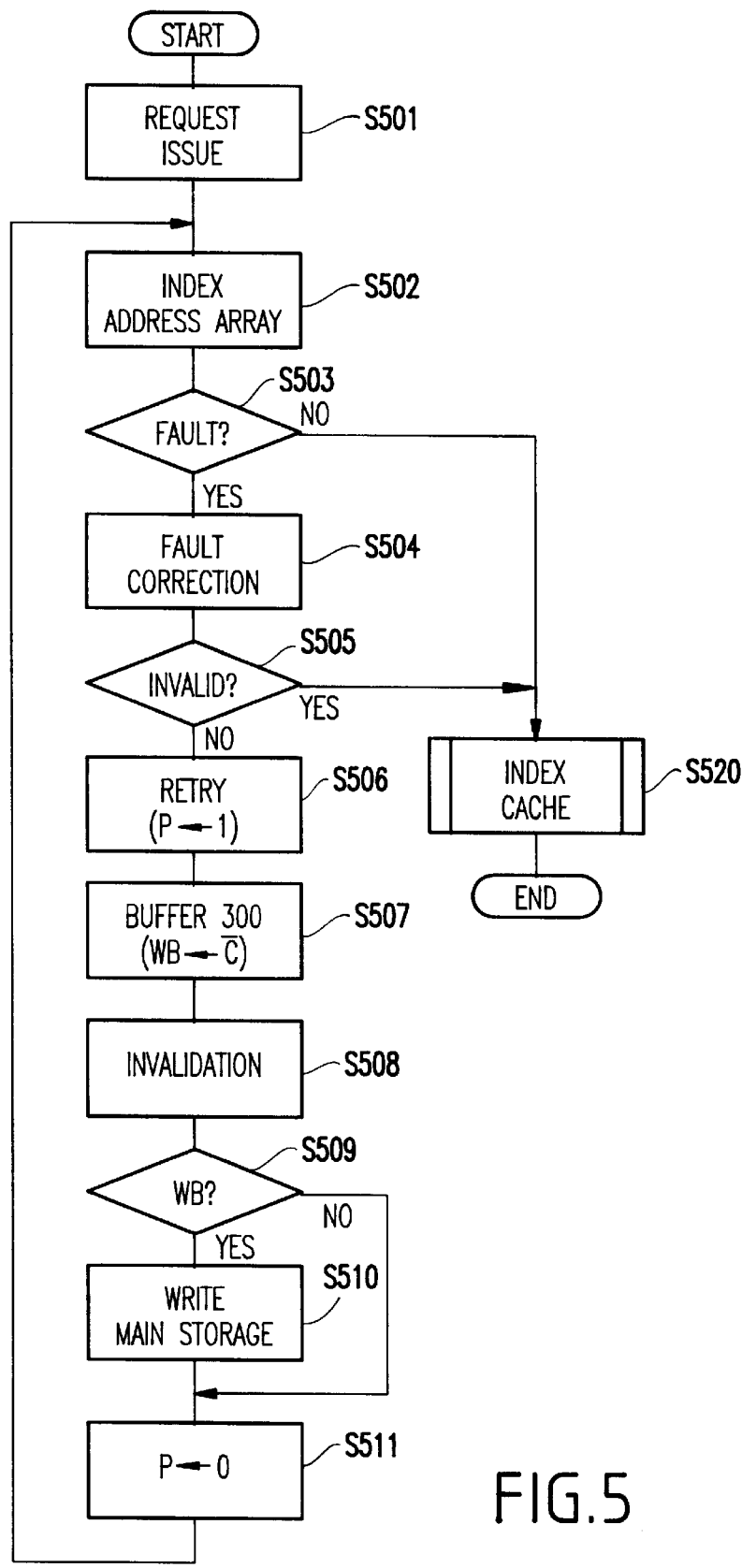
FIG. 5 is a flowchart showing a fault correction operation in the store-in cache memory according to an embodiment of the present invention.

Referring to FIGS. 1 and 5, when a processor issues a request for accessing the main memory in step S501, an address of the request is stored in the address register 101. In the next timing, the address of the request is stored in the address register 201, and the address array 200 is indexed by the address stored in the address register 201 in step S502. Upon indexing, if a fault is detected in step S503, then the following operations are executed. As mentioned above, a fault is preferably detected by checking the parity bits (not shown).

After correction of the fault in step S504, if the fault entry is "valid" (step S505), then the valid register 301 is reset to be "invalid" and the pending register 103 is set to be "pending" in step S506. In this case, the address remains in the address register 101 and the valid register 102 remains "valid".

The address tag corrected in the fault correction circuit 270 and the remaining address portion stored in the address register 201 is stored into the replacement buffer 300 (step S507). The write-back field 313 is set to be "write-back necessary" when the clean field 213 of the fault entry represents "not clean" (e.g., "dirty"), and set to be "write-back not necessary" when the clean field 213 of the fault entry represents "clean". This setting of the write-back field is a feature of the present invention.

The address register 201, the flush register 204, and the write-back register 203 are set by the outputs 391, 392, and 393 of the replacement buffer 300, respectively. Thus, the address array 200 is invalidated by using the address stored in the address register 201 in step S508.

At a next timing, if the write-back register 303 represents "write-back necessary" (step S509), then the data is stored into the main memory using the address stored in the address register 301 (step S510).

After the retry process, the pending register 103 is reset to be "not pending" (S511). At this time, since the fault entry is invalidated, the normal cache indexing is processed (steps S502–520).

If a fault has not occurred (step S503), then the valid register 102 is reset to be "invalid" and the normal cache indexing is processed in step S520. By the same token, even though a fault has occurred, if a fault entry is invalid (step S505), then the fault is assumed not to have occurred. This assumption is one of the features of the present invention.

Figure 6:
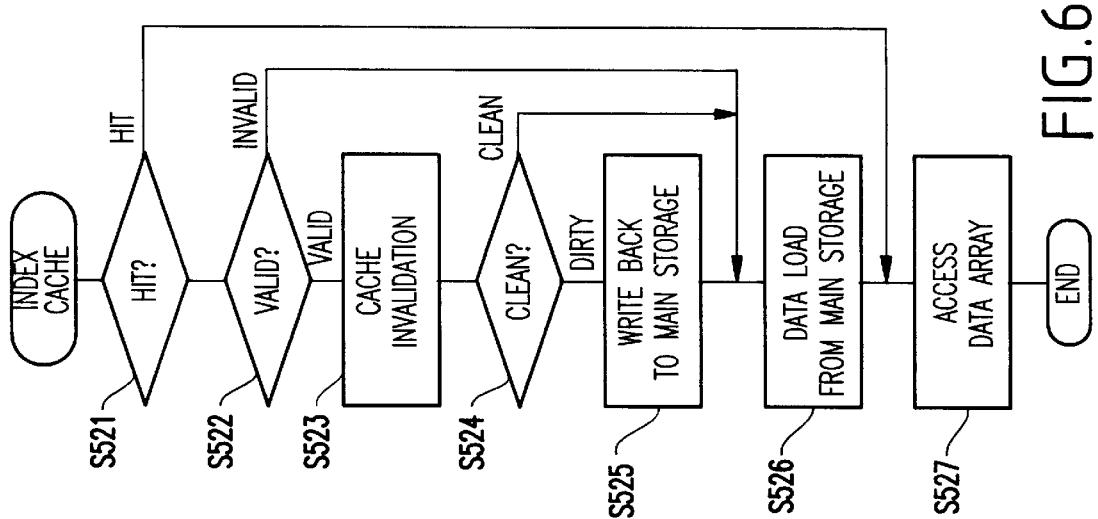
FIG. 6 is a flowchart showing an indexing operation in the store-in cache memory according to an embodiment of the present invention.

Referring to FIG. 6, if a cache hit occurred (step S521), then the data array is accessed (step S527). If an entry tobe replaced is invalid (step S522), then the corresponding data is loaded from the main memory (step S526), and the data array is accessed (step S527).

If the entry to be replaced is valid (step S522), then the entry is invalidated (step S523). In this case, if the entry is "dirty" (step S524), the data in the entry is written back to the main memory (step S525). Thereafter, the corresponding data is loaded from the main memory (step S526), and the data array is accessed (step S527).

Figure 7:
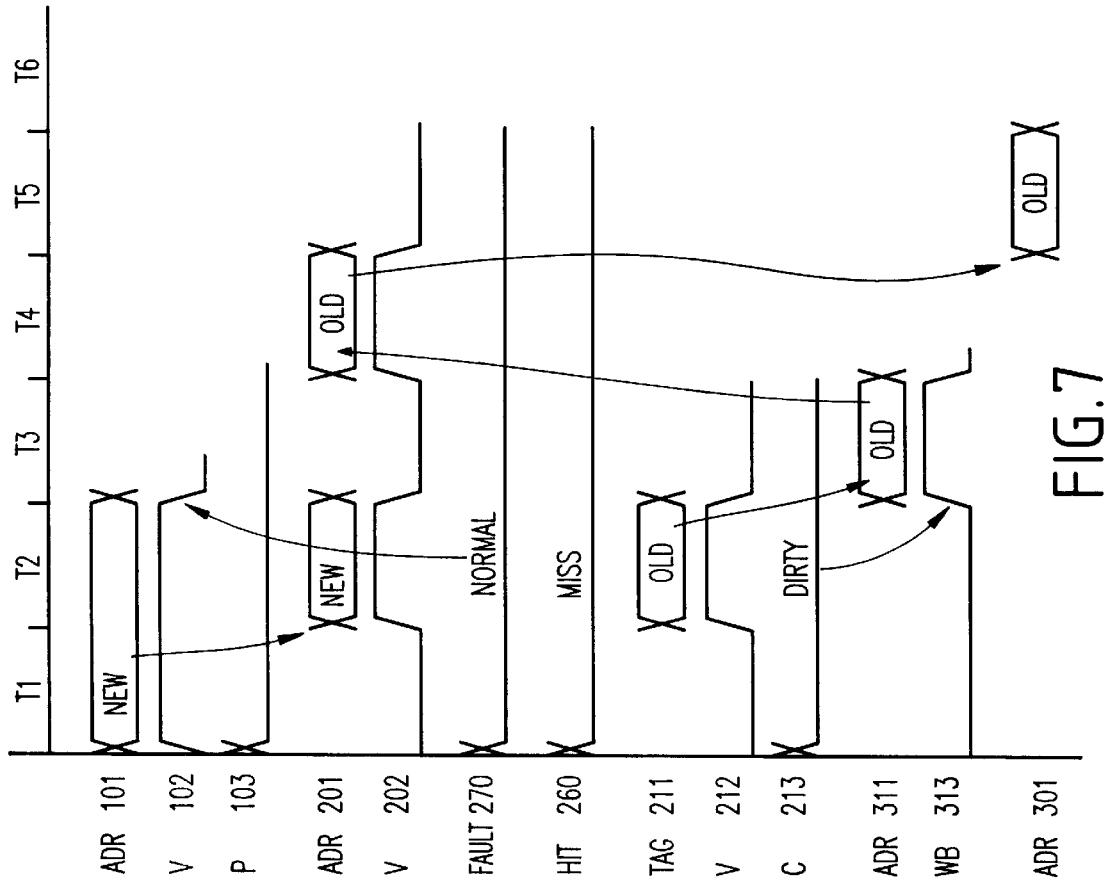
FIG. 7 is a timing chart showing the normal operation in the store-in cache memory according to an embodiment of the present invention.

Referring to FIG. 7, the operation timing when no fault exists (e.g., a normal operation) is shown. At time T1, a "new" address is stored in the address register 101, and the valid register 102 is activated.

At time T2, the "new" address is stored in the address register 201, and the valid register 202 is activated. The address array 200 is indexed. No fault is detected in the fault correction circuit 270, and a cache miss is detected in the cache hit judgement circuit 260. The address tag field 211 indicates an "old" address, and the clean field 213 indicates "dirty".

At time T3, the valid registers 102 and 202 are reset to be "invalid". The "old" address is stored into the replacement buffer 300. Then, the write-back field 313 is activated.

The "old" address is outputted from the replacement buffer 300 and stored in the address register 201 at time T4. Also, the valid register 202 is activated. Thus, the address array is invalidated.

At time T5, the "old" address is stored in the address register 301, and the corresponding data is stored into the main memory by using the address stored in the address register 301 because the write-back register 303 reflects a "write-back necessary".

Figure 8:
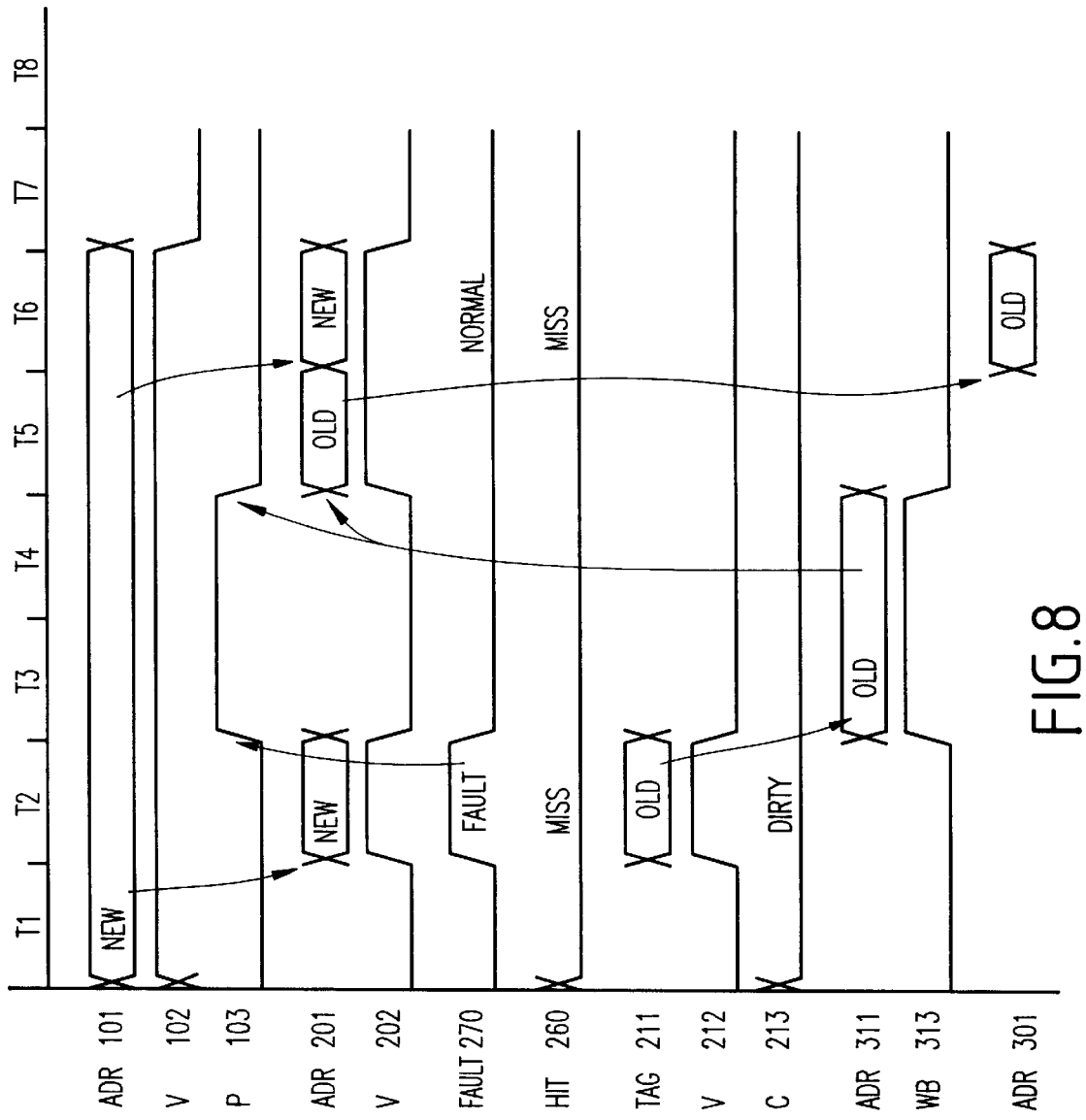
FIG. 8 is a timing chart showing the fault correction operation in the store-in cache memory according to an embodiment of the present invention.

Referring to FIG. 8, the operation timing for a fault is shown. At time T1, a "new" address is stored in the address register 101, and the valid register 102 is activated.

At time T2, the "new" address is stored in the address register 201, and the valid register 202 is activated. The address array 200 is indexed. A fault is detected in the fault correction circuit 270, a cache miss is detected in the cache hit judgement circuit 260. The address tag field 211 indicates an "old" address, and the clean field 213 indicates "dirty".

At time T3, the valid register 202 is reset to be "invalid". In this case, the valid register 102 is not reset, and the pending register 103 is set to be "pending". The "old" address is stored into the replacement buffer 300. Then, the write-back field 313 is activated.

The "old" address is outputted from the replacement buffer 300 and stored in the address register 201 at time T5. Also, the valid register 202 is activated. Thus, the address array is invalidated.

At time T6, the "old" address is stored in the address register 301, and the corresponding data is stored into the main memory by using the address stored in the address register 301 because the write-back register 303 represents "write-back necessary".

The "new" address is stored in the address register 201 at time T6. In this time, no fault is detected in the fault correction circuit 270.

As is apparent from the above description, according to the present invention, since a cache hit judgement and a fault correction are performed simultaneously, a machine cycle is reduced in a store-in cache memory. Thus, system reliability as well as system performance is increased.

While the invention has been described in terms of a preferred embodiment, those skilled in the art will recognize that the invention can be practiced with modification within the spirit and scope of the appended claims.

What is claimed is:

1. A fault correction apparatus for an address array of a cache memory, said address array having at least one entry, each of said at least one entry including a first field, a second field, and a third field, said apparatus comprising:

a cache hit judgement circuit, connected to said address array, for judging whether a cache hit has occurred;

a fault correction circuit, connected to said address array in parallel with said cache hit judgement circuit, for detecting a fault in the contents read out of each of said first, second, and third fields in said address array, and correcting the fault;

a replacement controller, connected to both said cache hit judgement circuit and said fault correction circuit, for controlling a replacement of an entry in said address array; and a replacement buffer, connected to said fault correction circuit and said replacement controller, for storing at least one entry to be replaced.

2. The fault correction apparatus according to claim 1, further comprising:

a retry controller, connected to said fault correction circuit, for controlling a retry of a request.

3. The fault correction apparatus according to claim 2, wherein said replacement controller stores an entry, in which a fault is detected, into said replacement buffer for a cache hit as well as for a cache miss.

4. The fault correction apparatus according to claim 2, wherein said first, second, and third fields comprise an address tag field, a valid field, and a clean field, respectively, and wherein said replacement controller determines that a fault has not occurred when the valid field of the entry, in which a fault is detected, represents an invalid state.

5. The fault correction apparatus according to claim 2, wherein said first, second, and third fields comprise an address tag field, a valid field, and a clean field, respectively, and wherein the entry in said replacement buffer includes an address field, a write-back field, and a valid field, and said replacement controller stores a complement of the clean field of the entry, in which a fault is detected, into the write-back field of said replacement buffer when the valid field of the entry, in which a fault is detected, represents a valid state.

6. The fault correction apparatus according to claim 1, wherein the judging, by the cache hit judgment circuit, whether a cache hit has occurred and the fault correction, by said fault correction circuit, are performed simultaneously.

7. A cache memory system having a pipelined structure, comprising:

a first stage for receiving a request from a processor;

a second stage for indexing an address in the request; and a third stage for accessing a main memory, and buffering an entry to be replaced, wherein said second stage includes:

an address array having at least one entry, each of said at least one entry including a first field, a second field, and a third field;

a cache hit judgement circuit, connected to said address array, for judging whether a cache hit has occurred;

a fault correction circuit, connected to said address array in parallel with said cache hit judgement circuit, for detecting a fault in the contents read out of each of said first, second and third fields in said address array, and correcting the fault; and a replacement controller, connected to both said cache hit judgement circuit and said fault correction circuit, for controlling a replacement of an entry in said address array, wherein said third stage includes:

a replacement buffer, connected to said fault correction circuit and said replacement controller, for storing at least one entry to be replaced.

8. The cache memory system according to claim 7, said second stage further comprising:

a retry controller, connected to said fault correction circuit, for controlling a retry of the request from the processor.

9. The cache memory system according to claim 8, wherein said first stage comprises:

a first address register for storing an address contained in the request;

a first valid register for storing a valid bit indicating whether said first address register stores a valid address;

a pending register for indicating whether an address stored in said first address register is in a pending state; and a valid generator, connected to said first valid register and said pending register, for generating a valid bit for the second stage if said first valid register indicates a valid state and said pending register indicates a non-pending state.

10. The cache memory system according to claim 9, wherein said second stage comprises:

a second address register for storing one of an address from said first address register and an address from said replacement buffer;

a second valid register for storing the valid bit, generated by said valid generator, indicating whether said second address register stores a valid address;

a first write-back register, connected to said replacement buffer, for indicating whether an address stored in said second address register is for a write-back; and a flush register, connected to said replacement buffer, for indicating whether an address stored in said second address register is for flushing an entry in said address array.

11. The cache memory system according to claim 10, wherein said third stage further comprises:

a third address register for storing an address from said second address register;

a third valid register for storing a valid bit from said second valid register; and a second write-back register, connected to said first write-back register, for indicating whether an address stored in said third address register is for a write-back.

12. The cache memory system according to claim 11, wherein said retry controller resets said first valid register to an invalid state when no fault is detected, and wherein said retry controller resets said third valid register to an invalid state and sets said pending register to a pending state when a fault is detected.

13. The cache memory system according to claim 7, said replacement buffer having a first-in first-out structure.

14. The cache memory system according to claim 7, wherein said first, second, and third fields comprise an address tag field, a valid field, and a clean field, respectively, and wherein said replacement controller controls said replacement buffer to store an entry to be replaced one of when a fault has not occurred, a cache miss has occurred, and a valid field in the entry to be replaced represents a valid state, and when a fault has occurred, and a valid field in the fault entry represents a valid state.

15. The cache memory system according to claim 7, wherein said replacement controller stores an entry, in which a fault is detected, into said replacement buffer for a cache hit as well as for a cache miss.

16. The cache memory system according to claim 7, wherein said first, second, and third fields comprise an address tag field, a valid field, and a clean field, respectively, and wherein said replacement controller determines that a fault has not occurred when the valid field of the entry, in which a fault is detected, represents an invalid state.

17. The cache memory system according to claim 7, wherein said first, second, and third fields comprise an address tag field, a valid field, and a clean field, respectively, and wherein the entry in said replacement buffer includes an address field, a write-back field, and a valid field, and said replacement controller stores a complement of the clean field of the entry, in which a fault is detected, into the write-back field of said replacement buffer when the valid field of the entry, in which a fault is detected, represents a valid state.

18. The cache memory system according to claim 7, wherein the judging, by the cache hit judgment circuit, whether a cache hit has occurred and the fault correction, by said fault correction circuit, are performed simultaneously.

19. A method of fault correction for an address array of a cache memory, said method comprising:

judging a cache hit in said address array;

simultaneously with said judging step, detecting whether a fault exists in the contents read out of fields in said address array and correcting said fault occurring in said address array; and thereafter, determining whether an entry in said address array should be replaced based on whether a fault has been detected.

20. The method of fault correction for the address array of the cache memory according to claim 19, further comprising:

storing an entry, in which a fault is detected, into a replacement buffer for a cache hit as well as for a cache miss.

21. The method of fault correction for the address array of the cache memory according to claim 19, further comprising:

determining that a fault has not occurred when a valid field of an entry, in which a fault is detected, represents an invalid state.

22. The method of fault correction for the address array of the cache memory according to claim 19, further comprising:

storing a complement of a clean field of an entry, in which a fault is detected, into a write-back field of a replacement buffer when a valid field of an entry, in which a fault is detected, represents a valid state.

* * * * *